United States Patent [19]

Herrmann et al.

[11] Patent Number: 4,919,899
[45] Date of Patent: * Apr. 24, 1990

[54] CRYSTAL GROWTH APPARATUS

[76] Inventors: Frederick T. Herrmann, 10006 Covington Dr., Huntsville, Ala. 35803; Blair J. Herren, 109 9th Pl. N.E., Arab, Ala. 35016

[ * ] Notice: The portion of the term of this patent subsequent to Dec. 12, 2006 has been disclaimed.

[21] Appl. No.: 161,681

[22] Filed: Feb. 29, 1988

[51] Int. Cl.$^5$ .................. C30B 35/00; C30B 23/00; C30B 29/54; C30B 7/02

[52] U.S. Cl. .................. 422/245; 156/600; 156/601; 156/607; 156/DIG. 62; 156/DIG. 113; 422/50; 422/99; 435/313

[58] Field of Search .................. 422/101, 245, 70, 50, 422/99; 435/101, 174; 156/608, DIG. 72, 607, DIG. 62, DIG. 113, 600, 601; 204/402, 73; 540/465; 202/197; 55/97, 87, 178

[56] References Cited

U.S. PATENT DOCUMENTS 4,263,010  4/1981  Randolph .................. 422/245
4,755,363  7/1988  Fujita et al. .................. 422/245

*Primary Examiner*—Gary P. Straub

[57] ABSTRACT

This invention relates generally to crystal growth devices, and more particularly to a device in which protein crystals are grown in a hanging drop (12). The drop (12) is suspended from a surface (32) positioned in the interior (21) of an enclosure (18) which is sealably coupled via a valve (56) to a vessel (16) containing solvent used in the drop (12). A second opening in the enclosure (18) is coupled via a valve (54) to a vessel (14) containing a selected desiccant material (44). The valve (56) may be fully or partially opened to add a selected quantity of solvent in a vapor phase to the drop (12), and the valve (54) may be fully or partially opened to cause a selected quantity of solvent to evaporate from the drop (12). The process is monitored by a camera (70), and in conjunction with a graduated pattern superimposed over the drop (12), relative volumes of the drop (12) are determinated. Alternately, the process may be automated by using a computer (94) coupled to servo motors (96, 98, 100), which in turn are coupled to and operate a cap (26) and valves (54, 56), respectively. The computer (94) is responsive to a detection device (92) which detects changes of light passing through the drop (12) from the light source (76).

11 Claims, 3 Drawing Sheets

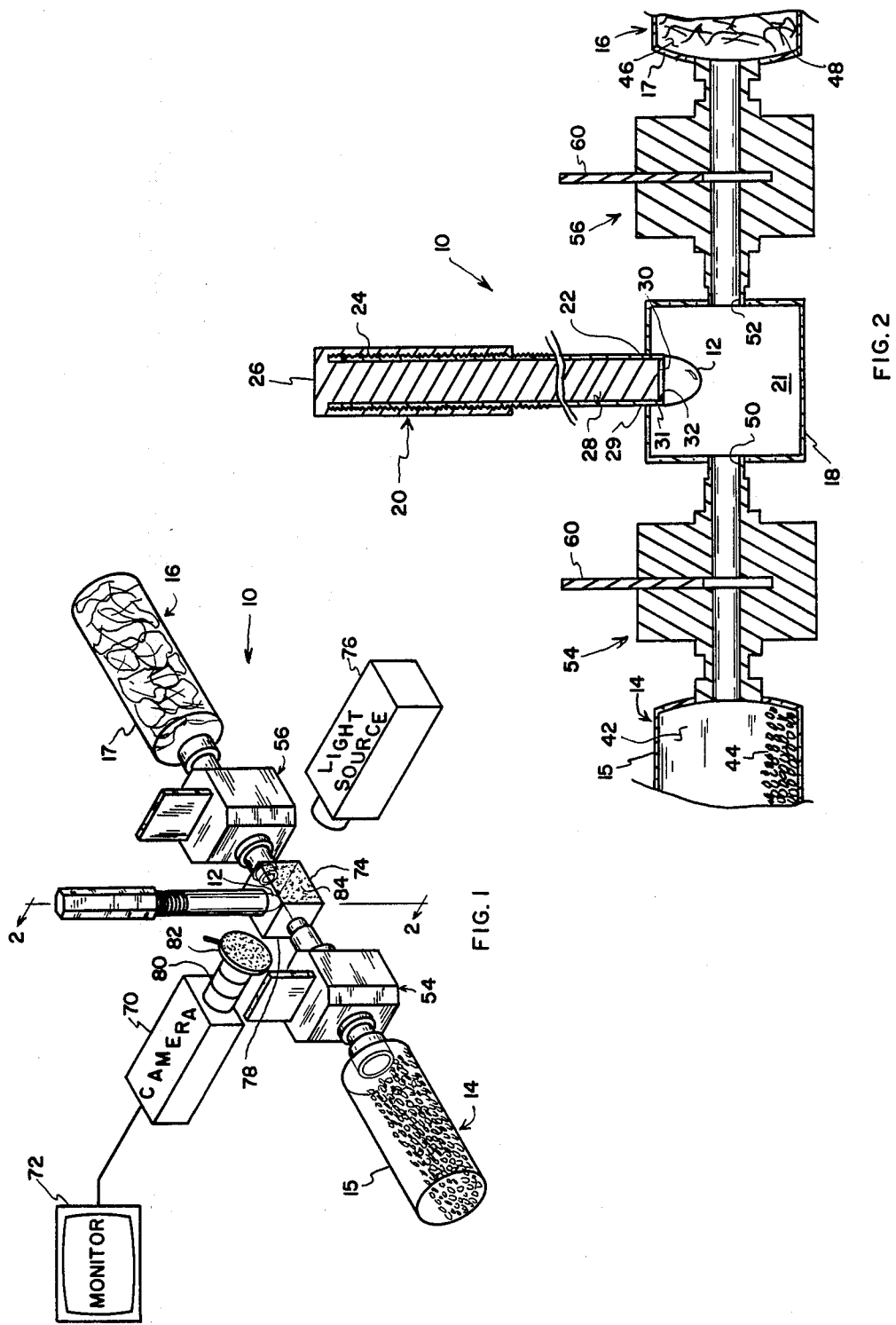

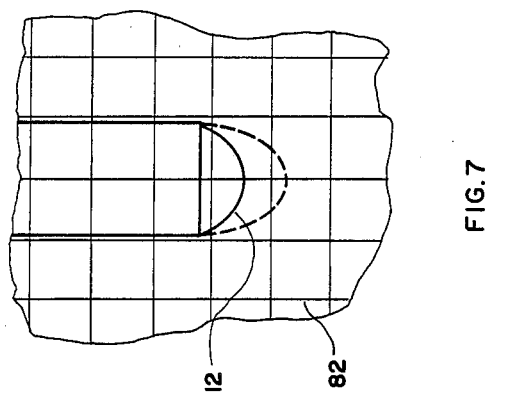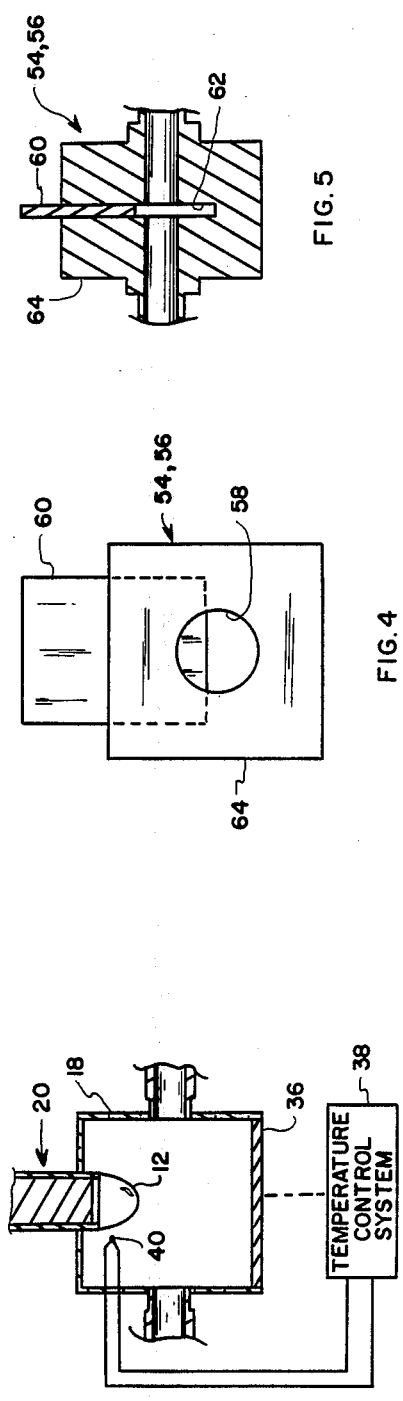

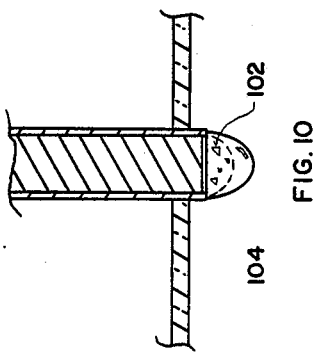
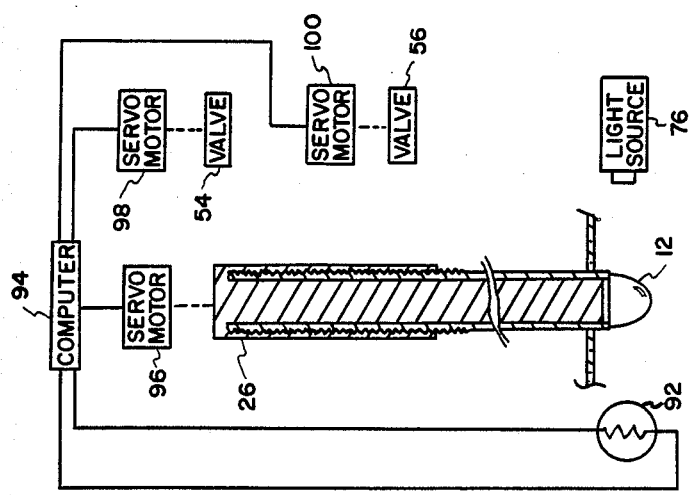
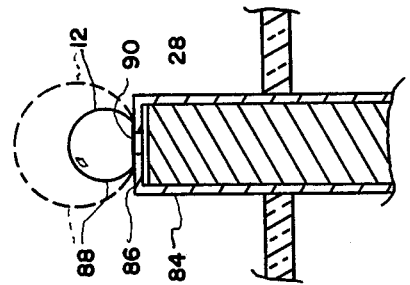

CRYSTAL GROWTH APPARATUS

ORIGIN OF THE INVENTION

The invention described herein was made by employees of the United States Government and may be manufactured and used by or for the Government for Government purposes without the payment of any royalties thereon or therefor.

TECHNICAL FIELD

This invention relates generally to crystal growth devices and more particularly to such a device wherein a drop of fluid containing dissolved crystalline material is exposed either to a source of desiccant for removing solvent therefrom, or to a source of solvent in a vapor phase for adding solvent thereto, allowing the saturation point of the dissolved crystalline material to be controllably approached.

BACKGROUND OF THE INVENTION

As studies relating to protein molecular structures have become increasingly important in all biomedical fields, it has become necessary to grow improved, highly ordered, single protein crystals which will exhibit higher resolution during protein crystallography. High quality crystals allow researchers to define protein molecular structures in greater detail. Knowledge gained through protein crystallography with X-ray diffraction and computer modeling is invaluable for applications in areas of drug design, protein engineering, material science, agriculture, as well as for the establishment of structural and functional foundations of biochemistry and molecular biology.

To date, the art of growing protein crystals has been a relatively inexact science because of the difficulties in controlling the many parameters which affect protein crystal growth, such as protein and precipitant concentrations, temperature, degree of alkalinity and acidity, and equilibration rate. Computer technology, on the other hand, has reduced the time necessary to interpret the results of protein crystallography on a particular crystal from a period of months to, in most cases, a few days. As a result, more crystals can be studied in a given time frame, which directs more emphasis toward the ability to grow improved, more uniform protein crystals as a matter of routine.

One method which is used to grow protein crystals is the liquid diffusion method in which a protein solution and a precipitant solution are made to come into contact with each other and are allowed to mix by diffusion to produce the condition in which the protein becomes less soluble and begins to crystallize. Since liquid-liquid diffusion in a gravity environment is disrupted by convection currents, this method has achieved only limited success.

Another method used to grow protein crystals is the dialysis method in which a solution containing dissolved protein to be crystallized is contained behind a dialysis membrane which separates it from a precipitant solution. This semi-permeable membrane allows small solute molecules and ions to pass through, while larger protein molecules remain contained. The protein container having the dialysis cover is immersed in the precipitant solution, which has a relatively high concentration of solute, such as sodium chloride or methyl pentane diol, resulting in a concentration gradient between the precipitant solution and the protein solution. This gradient causes solute from the precipitant solution to move through the membrane into the protein solution. As solute concentration increases in the protein solution, the dissolved protein becomes less soluble, crystal nucleation occurs, forming nuclei of small crystallites which increase in size to produce the desired crystals. In this method, however, there are typically no provisions to control the rate at which solute moves through the membrane, meaning that the rate of crystal growth cannot be precisely controlled.

One of the primary methods of growing protein crystals is the hanging drop method in which a droplet of protein and precipitant (such as sodium chloride or methyl pentane diol) solution is suspended over a reservoir containing a precipitant solution of relatively high concentration within a gas-tight container. The difference in vapor pressure between the droplet and the reservoir causes water vapor to be transported through the vapor phase from the droplet to the reservoir, thus decreasing the droplet size as the droplet attempts to reach vapor pressure equilibrium. In turn, this concentrates the dissolved protein, and as the protein becomes less soluble, crystal nucleation occurs, forming crystallites which increase in size to produce the desired crystals. Problems with this method are a lack of control of the rate at which a droplet size is changed and the inability to increase drop size.

It is, therefore, an object of this invention to provide an apparatus which will allow an operator or control system to control the rate at which drop size is modified and to modify drop size by either moving solvent (usually water) from the drop or by adding solvent to the drop via the vapor phase.

SUMMARY OF THE INVENTION

In accordance with this invention, a crystal growth apparatus is constructed having a sealable enclosure with support means positioned therein for supporting a drop of fluid within which crystalline material is dissolved. A pair of openings are provided in the enclosure, with one opening being coupled via a valve to a source of solvent, and the other opening being coupled via a valve to a source of desiccant material. Solvent in a vapor phase is either added to or removed from the drop of fluid by operating the valves so that the drop is exposed either to the source of solvent or the source of desiccant material.

BRIEF DESCRIPTION OF THE DRAWINGS

FIG. 1 is a pictorial view of the preferred embodiment of the present invention.

FIG. 2 is a sectional view taken along line 2—2 of FIG. 1.

FIG. 3 is a broken-away view of a temperature regulating system employed in one embodiment of the present invention.

FIG. 4 is an end view of one of a pair of valves used in the present invention.

FIG. 5 is a broken-away side view of one of the valves of the present invention.

FIG. 6 is a sectional side view of an alternate embodiment of the present invention.

FIG. 7 is a view of a drop of fluid with a rectilinear grid superimposed thereover.

FIG. 8 is a view of a drop of fluid disposed on a support of the present invention adapted for use in a microgravity environment.

FIG. 9 is a partially diagrammatic, partially schematic illustration of an automated embodiment of the present invention.

FIG. 10 illustrates particular details of the operation of an embodiment of the present invention.

DETAILED DESCRIPTION OF THE PREFERRED EMBODIMENT

Referring to FIG. 1, a crystal growth apparatus 10 is shown which is used to grow crystals by slowly reducing the volume (by evaporation) of a hanging drop 12 (when used in a gravity environment) of a solution containing a solvent and a material to be crystallized (usually a protein) and, in some cases, a selected quantity of a precipitating agent dissolved therein. The quantity and rate at which crystals are grown is controlled by exposing drop 12 to either a source 14 of desiccant material or a source 16 of solvent.

Apparatus 10 consists of an enclosure 18 (FIG. 2) having a fluid metering syringe 20 mounted to and in communicating relation with interior 21 of enclosure 18. Syringe 20 is equipped with a hollow body 22 within which the solution is placed and has an end 24 which is theaded for receiving a threaded cap 26. Cap 26 is provided with a plunger 28 centrally positioned in interior 30 of cap 26, which is closely sized to fit interior 32 of body 22 so that when cap 26 is rotated to move cap 26 in a downward direction, plunger 28 forces a selected quantity of fluid out of body 22 toward interior 21 of enclosure 18. An opposite end 29 of body 22 is provided with a support 31 which extends a short distance into interior 21 of enclosure 18, from which the selected quantity of fluid forms drop 12.

Sources 14 of desiccant and 16 of solvent consist of a pair of sealed vessels 15 and 17, respectively, (FIGS. 1 and 2), with interior 42 of vessel 15 being partially filled with a desiccant material 44 which is selected to absorb solvent used in drop 12. Interior 46 of vessel 17 is filled with a wicking material 48, such as glass wool, which is dampened by a quantity of like solvent to that in drop 12. In some instances, a selected quantity of a precipitating agent is dissolved in the solvent absorbed in glass wool 48 in order to achieve a predetermined drop size when vapor pressure equilibrium is established between the solvent in glass wool 48 and drop 12. Vessels 14 and 16 are coupled to opposed openings 50 and 52 in enclosure 18 via a pair of like valves 54 and 56 which, as illustrated in FIGS. 4 and 5, have openings 58 which may be partially or totally occluded by a blade 60 which slides in a slot 62 of valve body 64. This valve configuration may be used to fully open or close openings 50 and 52 or to regulate the rate at which solvent in a vapor phase is either removed or added to drop 12 by adjusting opening 58 of valves 54 and 56 to a predetermined size. When it is desired to decrease the vapor pressure of solvent in enclosure 28, blade 60 of valve 54 (FIG. 2) is partially or totally raised, exposing drop 12 to desiccant material 44, causing solvent in drop 12 to evaporate at a selected rate, which in turn decreases the volume of drop 12 and increases the concentration of crystalline material therein. Conversely, when it is desired to increase the vapor pressure of solvent in enclosure 18, such as when numerous crystals form and it is necessary to dissolve the smaller of these crystals, blade 60 of valve 56 is partially or totally raised, exposing drop 12 to a higher vapor pressure of the solvent absorbed in wicking material 48. Solvent in a vapor phase is then absorbed at a selected rate into drop 12, increasing its volume and decreasing the concentration of material to be crystallized.

Alternately, the rate of diffusion of solvent into or out of drop 12 may be controlled by varying the distance between drop 12 and openings 58 of valves 54 and 56. As shown in FIG. 6, this may be accomplished by coupling valves 54 and 56 to enclosure 18 with bellows 66. In this embodiment, when it is desired to alter the rate of diffusion of solvent in a vapor phase between drop 12 and either of valve openings 58, the selected valve is moved on bellows 66 closer or more distant from enclosure 18. The range of movement of bellows 66 is chosen to position openings 58 from one to five centimeters from drop 12.

For providing means for determining relative changes of the volume of drop 12, a camera 70 (FIG. 1) coupled to a monitor 72 is positioned on one side 74 of enclosure 18, with a light source 76 positioned on an opposite side 78, Lens 80 of camera 70 is provided with a graduated pattern, such as a rectilinear grid 82 shown in FIG. 7, which, when superimposed over drop 12, indicates the size of the profile of drop 12. A number of these images taken over a period of time are used to calculate (within ±5 percent) the concentration of crystalline material in drop 12, which in turn determines the appropriate procedure of opening or closing valves 54 and 56.

As one feature of this invention, a rotatable polarized filter 82 (FIG. 1) is positioned between lens 80 and enclosure 18, and together with a polarized film 84 disposed on side 74 of enclosure 18, polarizes the light passing through enclosure 18 from light source 76. During crystal growth, it is important to determine when crystals are beginning to form, or nucleate. By rotating polarized filter 82, images of optically active crystals beginning to nucleate may be enhanced, making them more readily observable and allowing an operator to appropriately adjust apparatus 10.

When growing some types of protein crystals, it is necessary to control the temperature in enclosure 18 to a selected temperature between 0° and 37° C. In this case, a lower wall 36 (FIG. 3) of enclosure 18 is constructed of a temperature conducting material, such as aluminum, and coupled to a conventional temperature control system 38. A thermocouple 40 is positioned in close proximity to the droplet to sense the temperature of drop 12 and generates, as an output, a signal which is fed to system 38. System 38 then either heats or cools wall 36 as necessary to heat or cool drop 12.

As an additional feature of this invention, apparatus 10 may be adapted to be used in a microgravity environment, which eliminates convection currents and other disruptive influences induced by gravity. In this embodiment, and referring to FIG. 8, drop 12 may be exuded by piston 28 onto a support 84 having a planar surface 86. In some instances, it is desirable to coat surface 86 with a hydrophobic substance, such as Teflon ™, which reduces contact area by increasing a contact angle between surface 86 and exterior 88 of drop 12. A small area 90 on support 84 may be coated with a hydrophilic material to prevent drop 12 from becoming detached from support 84 and floating free. Because of surface tension of the fluid in drop 12, drop 12 forms an almost perfect spherical configuration (except around surfactant area 90), which in turn allows the aforementioned imaging technique to more accurately indicate changes in diameter (and thus volume) of drop 12.

As a further feature of this invention, control of apparatus 10 may be automated by adding a device, such as a charge coupled device (CCD) (FIG. 9), which measures differences in intensity of light in place of camera 70. Other measurement techniques similar to this may be used to detect nucleating crystals, e.g., light scattering, refractive index, and ultraviolet light absorption. As shown, CCD 92 detects changes of intensity of light passing through drop 12, which is converted to an electrical signal in turn applied to a computer 94. Computer 94 is programmed to provide an appropriate operating sequence of events by adjusting servo motors 96, 98, and 100. Servo motor 96, coupled to cap 26, rotates cap 26 as necessary to create drop 12. Servo motors 98 and 100, coupled to valves 54 and 56, respectively, are used to open or close valves 54 and 56 or to adjust the size of openings 58.

In operation, and when apparatus 10 is to be used in a gravity environment, vessel 16 is filled with glass wool wicking 48 dampened by a solvent, such as water. Vessel 14 is partially filled by a selected desiccant, such as calcium chloride or sodium chloride, when water is used as a solvent. In a model system in which this invention is used to grow protein crystals, a material to be crystallized, such as lysozyme, is dissolved in the solvent (water) at approximately one-half the concentration at which crystals begin to form. In some instances, it is desirable to also dissolve a precipitating agent, which is typically a salt (such as NaCl), in the fluid of the drop to lower the concentration at which crystals will form. Because protein and precipitating agent concentrations are inversely proportional to drop size, the drop size change can be used to effectively control protein crystal growth rate. This fluid, containing water, lysozyme and NaCl, is placed in syringe 20, and cap 26 is rotated to move plunger 28 inward, which in turn exudes fluid. This fluid forms drop 12, which pendulously adheres to surface 32. Valve 54 connected to desiccant vessel 14 is then partially or fully opened, or closed, for selected time periods, depending on the rate at which it is desired to remove water from drop 12. Desiccant material 44 absorbs water in a vapor phase, lowering the vapor pressure of water in enclosure 18 and causing water in drop 12 to evaporate. This increases the concentration of lysozyme protein in drop 12 until lysozyme crystals begin to form. The change of drop size is visually monitored by observing drop 12 on monitor 72 (FIG. 1), using grid 82 (FIG. 7) as a reference. As the volume of drop 12 approaches one-half of its original volume (dotted lines in FIG. 10) and concentration of lyzozyme approaches the saturation point, rotatable polarizing filter 82 is rotated to more readily observe nucleating crystals. In the instance where numerous crystals nucleate, desiccant valve 54 is closed and solvent valve 56 is opened. Because the lysozyme and NaCl lowers the vapor pressure at which solvent in a vapor phase is drawn into drop 12, water in a vapor phase enters drop 12, dissolving all but the largest of the nucleated crystals 102. Next, desiccant valve 54 is opened a selected amount, which slowly reduces the vapor pressure in enclosure 18 and causes water to slowly evaporate from drop 12. This again slowly increases the concentration of lysozyme in drop 12, causing additional lysozyme to be deposited on the fewer in number and larger crystals which survived the redissolving phase described above. In other instances, only a few crystals nucleate, which eliminates the need to redissolve the smaller crystals. In either case, by slowly approaching the saturation point of lysozyme as described, the discrete molecules thereof have more time to bind in a crystalline lattice, forming a more ordered crystal which yields a high value of resolution during X-ray crystallography.

When used in a microgravity environment, drop 12 (FIG. 8) is exuded onto planar surface 86. In some instances, surface 86 may be coated with Teflon ™, which causes drop 12 to assume an almost spherical configuration, making it easier to determine the volume of drop 12. Advantages of using apparatus 10 in a microgravity environment are that the growing crystals are exposed to the same environment on all faces, with crystalline material which is depleted adjacent a face of the crystal being replenished by diffusion rather than by convection currents. This is expected to result in fewer flaws in the growing crystals, which in turn are expected to have better resolution during X-ray crystallography.

Responsive to the foregoing, it is apparent that the applicants have provided a crystal growth apparatus for regulating growth rate of crystals grown in a drop of fluid. This is done by controllably adding or removing a selected quantity of solvent in a vapor phase to or from the drop, which results in larger crystals having better resolution than those grown in previously suggested devices.

We claim:

1. An apparatus for growing crystals comprising:
   a sealable enclosure having first and second openings;
   infinitely variable valve means coupled to said openings and disposed for controlling passage of gases therethrough;
   fluid support means positioned in said enclosure, said fluid support means having a surface disposed for supporting a drop of fluid, said drop including a crystalline material dissolved therein;
   a source of solvent vapor coupled via said valve means to said first opening, for selectively supplying solvent in a vapor phase to said drop, decreasing concentration of said dissolved crystalline material; and
   a source of desiccant coupled via said valve means to said second opening, for selectively removing solvent in a vapor phase from said drop, increasing the concentration of said dissolved crystalline material.

2. An apparatus as set forth in claim 1 including dispensing means for dispensing said drop, said dispensing means disposed adjacent to said support means.

3. An apparatus as set forth in claim 2 wherein a selected quantity of a like precipitating agent is disposed in said solvent supply means, for lowering vapor pressure thereof.

4. An apparatus as set forth in claim 1 including a preselected precipitating agent being disposed in said drop at a concentration of approximately one-half a concentration required to grow crystals from said dissolved crystalline material.

5. An apparatus as set forth in claim 4 wherein said reservoir of desiccant comprises a selected quantity of desiccant material, for removing a selected quantity of a solvent in a vapor phase from said drop.

6. An apparatus for growing crystals in a drop of fluid, said drop comprising a dissolved crystalline material and a dissolved precipitating agent therein, and being disposed on fluid support means positioned in a sealable, transparent enclosure having first and second infinitely adjustable openings, with low solvent vapor pressure means being coupled to said first opening, for removing solvent in a vapor phase from said drop, and high solvent vapor pressure means being coupled to said second opening, for adding solvent in a vapor phase to said drop, and video imaging means being positioned adjacent to said transparent enclosure, for observing changes of size, and thus volume, of said drop.

7. An apparatus as set forth in claim 6 wherein said video imaging means includes a source of illumination positioned on one side of said transparent enclosure, said source of illumination including regulating means for regulating the intensity of light passing through said enclosure and said drop, enhancing images of nucleating crystals therein, and further including a charged coupled device (CCD) positioned proximate said drop, for producing images of crystals therein.

8. An apparatus as set forth in claim 7 wherein said video imaging means further includes a rectilinear grid being superimposed over said drop, for determining size and thus volume thereof.

9. An apparatus as set forth in claim 8 wherein said fluid support means is disposed for use in a gravity environment, and said drop is pendulously disposed therefrom.

10. An apparatus as set forth in claim 8 wherein said fluid support means is disposed for use in a microgravity environment, and said drop is disposed on a planar surface thereof.

11. An apparatus as set forth in claim 10 wherein said planar surface comprises a hydrophobic surface surrounding a region coated with surfactant, for minimizing contact area between said drop and said surface while said region provides support to said drop.

* * * * *